United States Patent
Peters et al.

(10) Patent No.: US 12,413,048 B2
(45) Date of Patent: Sep. 9, 2025

(54) DILUTE NITRIDE LONG-WAVELENGTH EMITTER WITH IMPROVED PERFORMANCE OVER TEMPERATURE

(71) Applicant: Lumentum Operations LLC, San Jose, CA (US)

(72) Inventors: Matthew Glenn Peters, Menlo Park, CA (US); Jun Yang, Cupertino, CA (US); Ajit Vijay Barve, San Jose, CA (US); Guowei Zhao, Milpitas, CA (US)

(73) Assignee: Lumentum Operations LLC, San Jose, CA (US)

( * ) Notice: Subject to any disclaimer, the term of this patent is extended or adjusted under 35 U.S.C. 154(b) by 581 days.

(21) Appl. No.: 17/808,030

(22) Filed: Jun. 21, 2022

(65) Prior Publication Data
US 2023/0261443 A1 Aug. 17, 2023

Related U.S. Application Data

(60) Provisional application No. 63/268,099, filed on Feb. 16, 2022.

(51) Int. Cl.
| | |
|---|---|
| H01S 5/00 | (2006.01) |
| H01S 5/183 | (2006.01) |
| H01S 5/30 | (2006.01) |
| H01S 5/323 | (2006.01) |
| H01S 5/34 | (2006.01) |
| H01S 5/042 | (2006.01) |

(52) U.S. Cl.
CPC ........ *H01S 5/3409* (2013.01); *H01S 5/18311* (2013.01); *H01S 5/18358* (2013.01); *H01S 5/309* (2013.01); *H01S 5/32366* (2013.01); *H01S 5/3407* (2013.01); *H01S 5/04252* (2019.08); *H01S 5/18305* (2013.01); *H01S 2304/02* (2013.01); *H01S 2304/04* (2013.01)

(58) Field of Classification Search
CPC .............. H01S 5/3409; H01S 5/18311; H01S 5/18358; H01S 5/309; H01S 5/32366; H01S 5/3407; H01S 5/04252; H01S 5/18305; H01S 2304/02; H01S 2304/04
See application file for complete search history.

(56) References Cited

U.S. PATENT DOCUMENTS

| | | | |
|---|---|---|---|
| 4,839,899 A * | 6/1989 | Burnham | H01S 5/34313 372/45.01 |
| 5,319,657 A * | 6/1994 | Otsuka | H01S 5/305 372/45.01 |
| 5,319,660 A * | 6/1994 | Chen | H01S 5/34 257/14 |

(Continued)

*Primary Examiner* — Kinam Park
(74) *Attorney, Agent, or Firm* — Harrity & Harrity, LLP

(57) ABSTRACT

In some implementations, a method may include forming a quantum well (QW) layer using an epitaxial growth process, where the epitaxial growth process is performed according to a first growth mode to form the QW layer. The method may include forming a quantum well barrier (QWB) layer using the epitaxial growth process, where the epitaxial growth process is performed according to a second growth mode to form the QWB layer. In some implementations, a nitrogen flux used in the first growth mode is different from a nitrogen flux used in the second growth mode. In some implementations, a gallium flux used in the first growth mode is different from a gallium flux used in the second growth mode.

20 Claims, 9 Drawing Sheets

(56) References Cited

U.S. PATENT DOCUMENTS

| | | | | |
|---|---|---|---|---|
| 5,550,393 | A * | 8/1996 | Nishimura | H01L 33/0025 257/E29.091 |
| 5,737,350 | A * | 4/1998 | Motoda | H01S 5/20 372/45.01 |
| 5,937,274 | A * | 8/1999 | Kondow | H01L 33/30 257/E27.128 |
| 6,393,038 | B1 * | 5/2002 | Raymond | H01S 5/18383 372/98 |
| 2006/0171440 | A1 * | 8/2006 | Ledentsov | G02B 5/285 372/99 |
| 2008/0308788 | A1 * | 12/2008 | Ebe | H01S 5/341 257/18 |
| 2013/0022073 | A1 * | 1/2013 | Achtenhagen | H01S 5/1228 372/45.01 |
| 2016/0301193 | A1 * | 10/2016 | Itoh | H01S 5/02251 |

* cited by examiner

US 12,413,048 B2

DILUTE NITRIDE LONG-WAVELENGTH EMITTER WITH IMPROVED PERFORMANCE OVER TEMPERATURE

CROSS-REFERENCE TO RELATED APPLICATION

This patent application claims priority to U.S. Provisional Patent Application No. 63/268,099, filed on Feb. 16, 2022, and entitled "DILUTE NITRIDE LONG-WAVELENGTH (>1200 NM) VCSELS WITH IMPROVED PERFORMANCE OVER TEMPERATURE." The disclosure of the prior application is considered part of and is incorporated by reference into this patent application.

TECHNICAL FIELD

The present disclosure relates generally to a vertical-cavity surface-emitting laser (VCSEL) and, more particularly, to a dilute nitride long-wavelength VCSEL with an active region that improves performance of the VCSEL over temperature.

BACKGROUND

A dilute nitride material, such as indium gallium arsenide nitride (InGaAsN) or InGaAsN antimony (InGaAsNSb), can be used as a material for an active region of a GaAs-based emitter (e.g., a VCSEL, an edge-emitting laser, or the like) to enable lasing at a long wavelength (e.g., a wavelength in a range from approximately 1200 nanometers (nm) to approximately 1600 nm).

SUMMARY

In some implementations, a method includes forming a quantum well (QW) layer using an epitaxial growth process, the epitaxial growth process being performed according to a first growth mode to form the QW layer; and forming a quantum well barrier (QWB) layer using the epitaxial growth process, the epitaxial growth process being performed according to a second growth mode to form the QWB layer, wherein at least one of: a nitrogen flux used in the first growth mode is different from a nitrogen flux used in the second growth mode, or a gallium flux used in the first growth mode is different from a gallium flux used in the second growth mode.

In some implementations, a dilute nitride long-wavelength emitter includes a cladding layer; an active region including one or more QW layers and one or more QWB layers; and a barrier layer between the active region and the cladding layer, wherein the barrier layer comprises a graded-index structure.

In some implementations, a dilute nitride long-wavelength emitter includes an active region including: one or more QW layers; and one or more QWB layers, wherein at least one QWB of the one or more QWB layers includes a p-doped region.

DETAILED DESCRIPTION

The following detailed description of example implementations refers to the accompanying drawings. The same reference numbers in different drawings may identify the same or similar elements.

Figure 1:
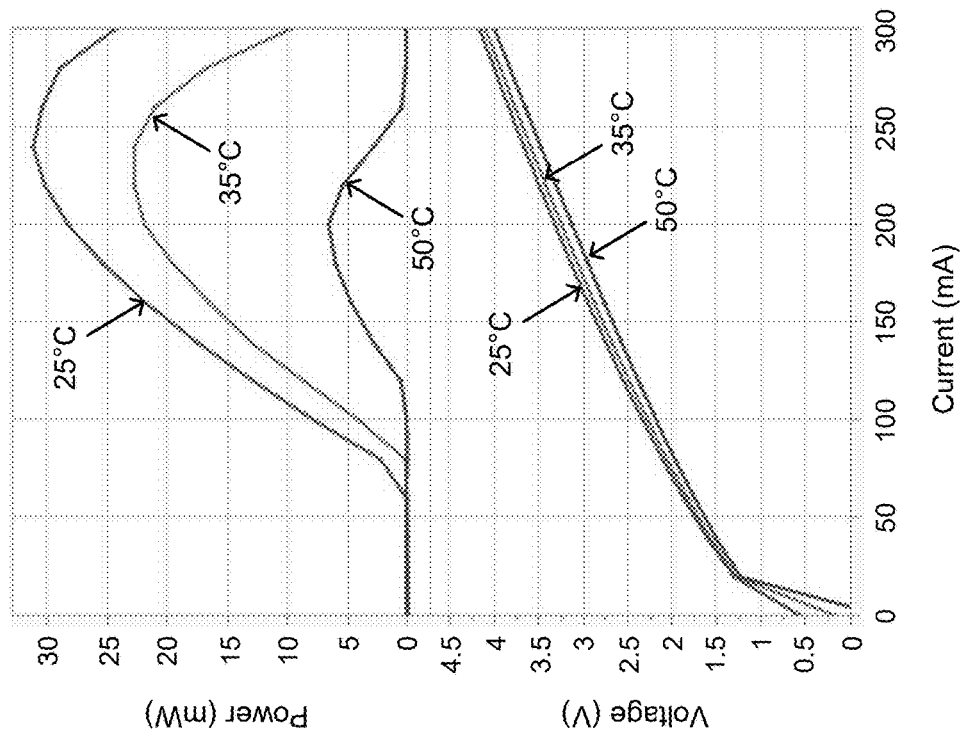
FIG. 1 is a diagram of an example of light-current-voltage (L-I-V) characteristics of a conventional dilute nitride long-wavelength VCSEL at different temperatures.

A dilute nitride material (e.g., InGaAsN, InGaAsNSb, or the like) can be used as a material for an active region of a GaAs-based emitter to enable long-wavelength lasing (e.g., lasing at a wavelength in a range from approximately 1200 nm to approximately 1600 nm). However, dilute nitride materials have relatively poor carrier confinement in a conventional quantum well (QW) active region, such as an active region that includes a typical InGaAsNSb/GaAsN heterostructure. The poor carrier confinement in the QW active region causes performance of the emitter to degrade significantly as temperature of the emitter increases. FIG. 1 is a diagram illustrating an example of light-current-voltage (L-I-V) characteristics of a conventional dilute nitride long-wavelength VCSEL at different temperatures. In the example shown in FIG. 1, the VCSEL is lasing at approximately 1380 nm and comprises an InGaAsNSb/GaAsN active region grown on a GaAs substrate. As illustrated in FIG. 1, at a comparatively higher operating temperature (e.g., 50 degrees Celsius (° C.) as compared to 25° C.), output power of the conventional long-wavelength VCSEL at a given voltage and current is degraded, meaning that performance of the conventional long-wavelength VCSEL degrades as temperature increases.

Some implementations described herein provide a dilute nitride long-wavelength emitter (e.g., a dilute nitride long-wavelength VCSEL) with improved performance over temperature. In some implementations, improved performance of the dilute nitride long-wavelength emitter over temperature is achieved by improving carrier confinement, improving carrier injection, or improving capture efficiency of the dilute nitride long-wavelength emitter. In some implementations, improved carrier confinement, improved carrier injection, or improved capture efficiency can be achieved by increasing a quantum well barrier (QWB) band gap in the dilute nitride long-wavelength emitter, by including a graded-index outer barrier in the dilute nitride long-wavelength emitter, or by including a p-doped region in a QWB of the dilute nitride long-wavelength emitter. Additional details are described below.

Figure 2A:
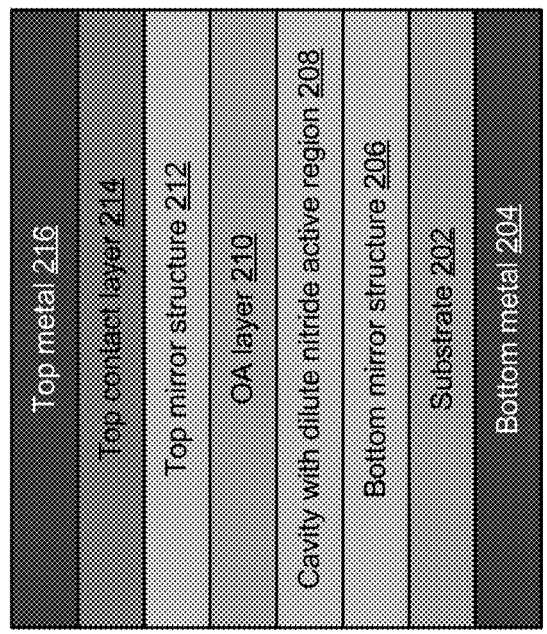
FIGS. 2A-2C are diagrams associated with an example implementation of a dilute nitride long-wavelength emitter array with improved performance over temperature, as described herein.
Figure 2B:
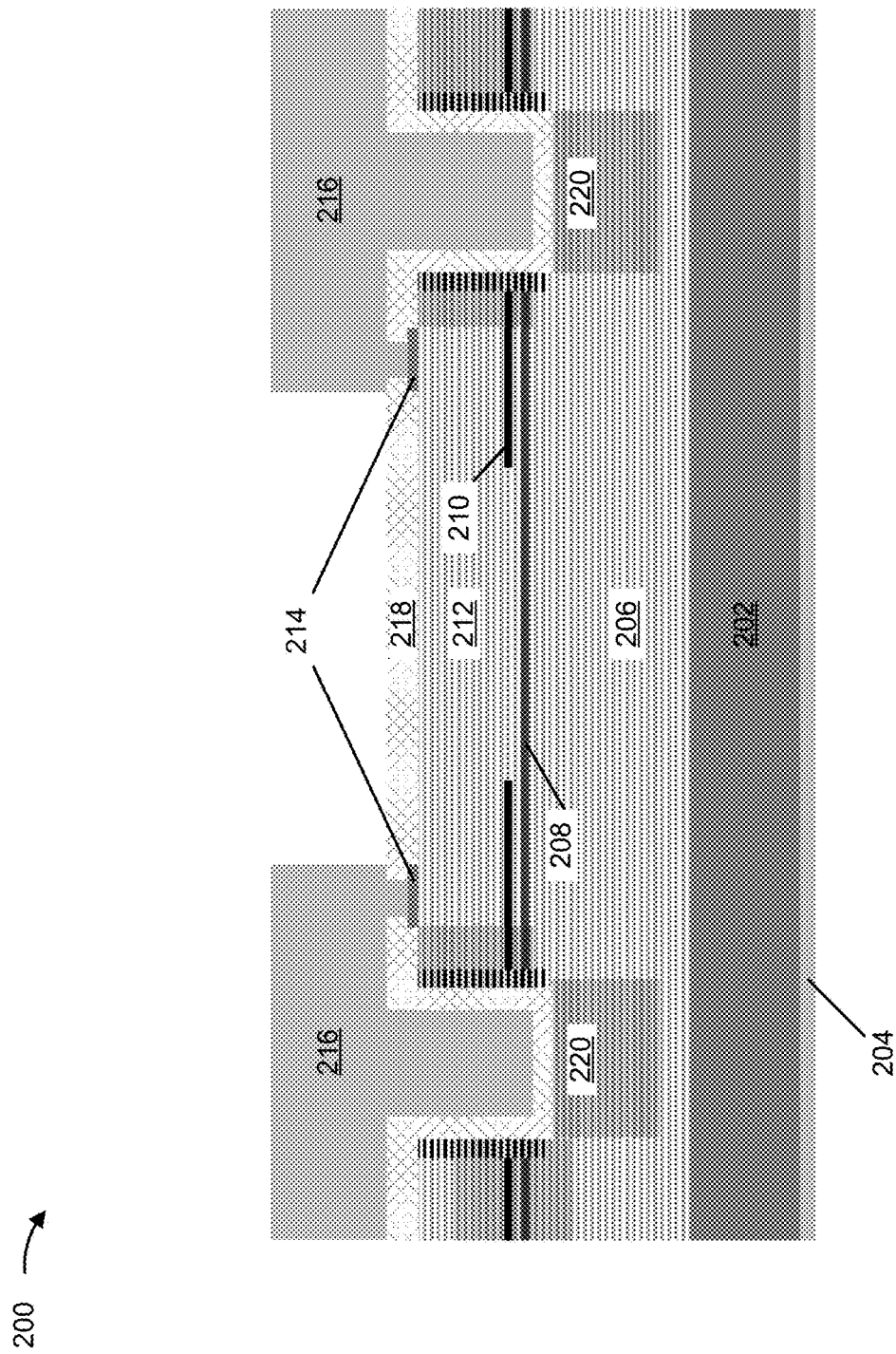
Figure 2C:
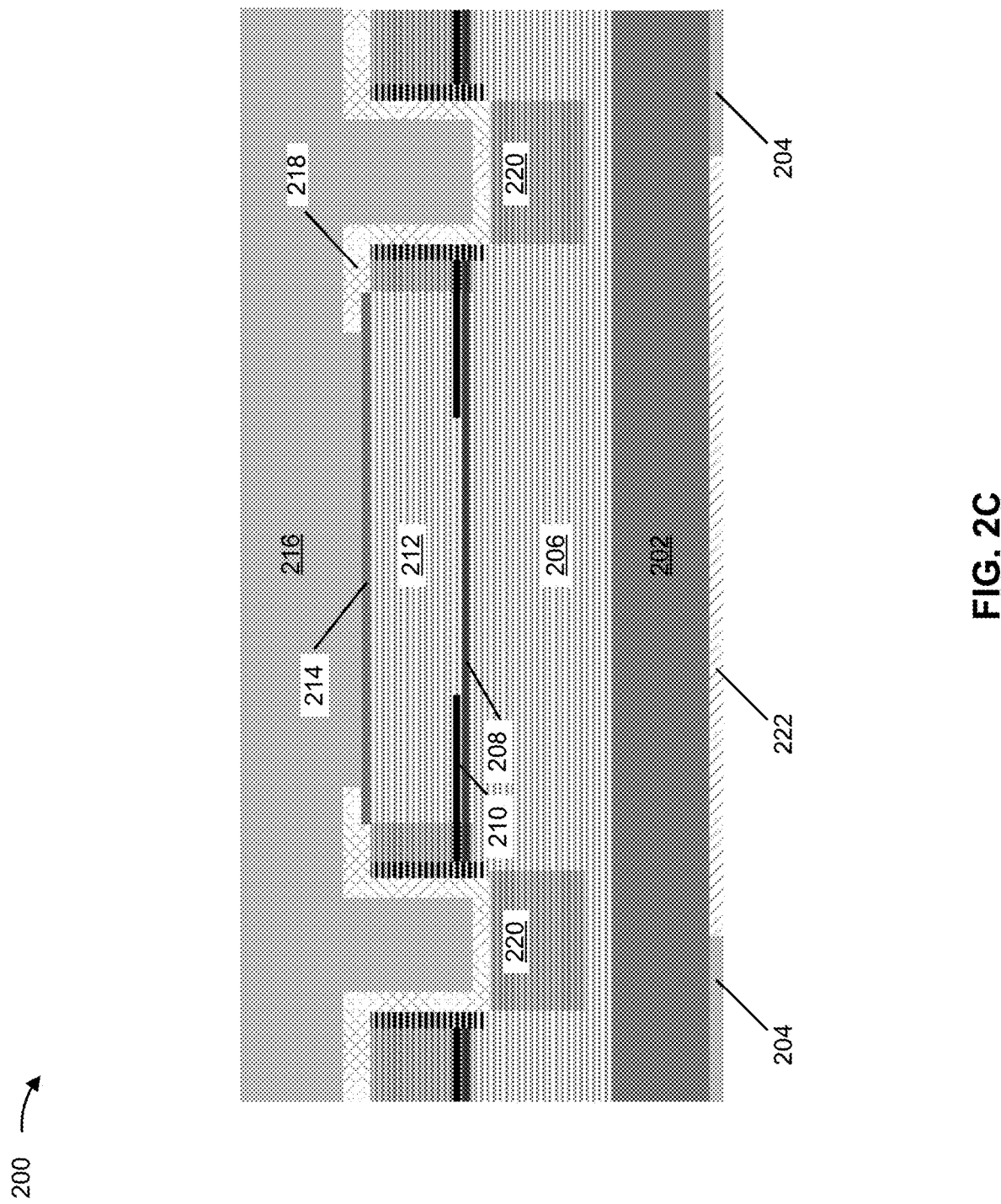

FIGS. 2A-2C are diagrams associated with an example implementation of a dilute nitride long-wavelength emitter array 200 with improved performance over temperature. FIG. 2A is a diagram illustrating various layers of the emitter array 200. In some implementations, the emitter array 200 includes a single emitter. In some implementations, the emitter array 200 includes an array of emitters. In some implementations, the emitters of the emitter array 200 include one or more top-emitting emitters or one or more bottom-emitting emitters. As shown in FIG. 2A, the emitter array 200 may include a substrate 202, a bottom metal 204, a bottom mirror structure 206, a cavity with dilute nitride active region 208 (herein referred to as cavity/active region 208), an optical aperture (OA) layer 210, a top mirror structure 212, a top contact layer 214, and a top metal 216.

Substrate 202 includes a supporting material upon which or within which one or more layers or features of the emitter array 200 are grown or fabricated. In some implementations, the substrate 202 comprises an n-type material. In some implementations, the substrate 202 comprises a semi-insulating type of material. In some implementations, the semi-insulating type of material may be used when the emitter array 200 includes one or more bottom-emitting emitters in order to reduce optical absorption from the substrate 202. In such an implementation, the emitter array 200 may include a contact buffer in or near the bottom mirror structure 206. In some implementations, the substrate 202 may be formed from a semiconductor material, such as gallium arsenide (GaAs), indium phosphide (InP), or another type of semiconductor material. In some implementations, a bottom contact (e.g., a bottom n-contact) of the emitter array 200 can be made from a backside of the substrate 202. In some implementations, the bottom contact of the emitter array 200 can be made from a front side of the emitter array 200. In some implementations, the front side contact can be achieved by, for example, etching a mesa step or trench to the substrate 202, or inserting a contact buffer in or near the bottom mirror structure 206.

Bottom metal 204 includes a metal layer on a bottom surface of the substrate 202 (e.g., at a backside of the emitter array 200). In some implementations, the bottom metal 204 is formed from an n-type material. In some implementations, the bottom metal 204 is a layer that makes electrical contact with the substrate 202. In some implementations, the bottom metal 204 serves as a cathode for the emitter array 200. In some implementations, the bottom metal 204 may serve as an anode for the emitter array 200. For example, in some implementations, the bottom metal 204 may serve as a common anode for a group of sub-arrays of a VCSEL array, where the emitter array 200 is one of the group of sub-arrays. In some implementations, the bottom metal 204 may include an annealed metallization layer, such as a gold-germanium-nickel (AuGeNi) layer, a palladium-germanium-gold (PdGeAu) layer, among other examples.

Bottom mirror structure 206 is a bottom reflector of an optical resonator of the emitter array 200. For example, the bottom mirror structure 206 may include a distributed Bragg reflector (DBR), a dielectric mirror, or another type of mirror structure. In some implementations, the bottom mirror structure 206 is formed from an n-type material. In some implementations, the bottom mirror structure 206 is on a top surface of the substrate 202. In some implementations, the bottom mirror structure 206 may have a thickness in a range from approximately 3.5 microns ($\mu$m) to approximately 9 $\mu$m, such as 5 $\mu$m. In some implementations, the bottom mirror structure 206 includes a set of layers (e.g., aluminum gallium arsenide (AlGaAs) layers) grown using a metal-organic chemical vapor deposition (MOCVD) technique, a molecular beam epitaxy (MBE) technique, or another technique.

Cavity/active region 208 includes one or more layers where electrons and holes recombine to emit light and define the emission wavelength range of the emitter array 200, where one or more QWs of the cavity/active region 208 are formed from a dilute nitride material. The dilute nitride material may in some implementations comprise a composite semiconductor using a combination of InGaAlAsPSb with a low percentage (e.g., less than approximately 5%) of nitrogen added to a Group V site to remain lattice-matched or lattice constant closer to a GaAs substrate to mitigate forming dislocations. The dilute nitride material from which the one or more QWs of the cavity/active region 208 are formed may include, for example, dilute nitride InGaAsN or InGaAsNSb. In some implementations, the cavity/active region 208 may include one or more cavity spacer layers. In some implementations, the one or more cavity spacer layers may enable epitaxial growth to have sufficient room for ramping compositions or temperature. In some implementations, the one or more cavity spacer layers may reduce strain between active regions of the cavity/active region 208. In some implementations, the one or more cavity spacer layers may mitigate thermal issues of laser operation. In some implementations, the one or more cavity spacer layers may include an oxidation layer. The optical thickness of the cavity/active region 208 (including cavity spacer layers), the top mirror structure 212, and the bottom mirror structure 206 define the resonant cavity wavelength of the emitter array 200, which may be designed within an emission wavelength range of the cavity/active region 208 to enable lasing. In some implementations, the cavity/active region 208 may be formed on the bottom mirror structure 206. In some implementations, the cavity/active region 208 may have a thickness in a range from approximately 0.006 $\mu$m to approximately 0.5 $\mu$m, such as 0.15 $\mu$m or 0.30 $\mu$m. In some implementations, the cavity/active region 208 includes a set of layers grown using an MOCVD technique, an MBE technique, or another technique.

In some implementations, the cavity/active region 208 may be designed so as to improve performance of the emitter array 200 over temperature, as described herein. Additional details regarding the cavity/active region 208 are provided below with respect to FIGS. 2A-2C and FIGS. 3A-3D.

OA layer 210 is a layer for forming an aperture that provides optical and electrical confinement for the VCSELs of the emitter array 200. In some implementations, the OA layer 210 enhances carrier and mode confinement of the emitter array 200 and, therefore, can improve performance of the emitter array 200. In some implementations, the OA layer 210 is on, under, or in the cavity/active region 208. In some implementations, there may be one or more spacer layers or mirror layers (e.g., DBRs) between the OA layer 210 and the cavity/active region 208. In some implementations, the OA layer 210 is on a side of the cavity/active region 208 nearer to the bottom mirror structure 206 (i.e., on a substrate side of the cavity/active region 208). In some implementations, the OA layer 210 is on a side of the cavity/active region 208 nearer to the top mirror structure 212 (i.e., on a non-substrate side of the cavity/active region 208). In some implementations, the emitter array 200 may include one or more OA layers 210.

In some implementations, the OA layer 210 is an oxide layer formed as a result of oxidation of one or more epitaxial layers of the emitter array 200. For example, the OA layer 210 may be an aluminum oxide ($Al_2O_3$) layer formed as a result of oxidation of an epitaxial layer (e.g., an AlGaAs layer, an AlAs layer, and/or the like). In some implementations, the OA layer 210 may have a thickness in a range from approximately 0.007 $\mu$m to approximately 0.04 $\mu$m, such as 0.02 $\mu$m. In some implementations, oxidation trenches (not shown in FIG. 2A, and shown as filled in FIG. 2B) etched around the VCSELs in the emitter array 200 may allow steam to access the epitaxial layer(s) from which the OA layer 210 is formed. In some implementations, the optical aperture has a circular shape. In some implementations, the optical aperture has a non-circular shape. In some implementations, a size (e.g., a diameter) of the optical aperture formed by the OA layer 210 is in a range from approximately 1 μm to approximately 300 μm, such as 5 μm or 8 μm. In some implementations, in addition to the one or more OA layers 210, the emitter array 200 may include one or more other types of structures or layers that provide current confinement, such as an implant passivation structure, a mesa isolation structure, a moat trench isolation structure, a buried tunnel junction, or the like. Additionally, or alternatively, such other types of structures or layers for providing current confinement may in some implementations be included in or integrated with one or more OA layers (e.g., one or more OA layers 210) of the emitter array 200.

Top mirror structure 212 is a top reflector of the optical resonator of the emitter array 200. For example, the top mirror structure 212 may include a DBR, a dielectric mirror, and/or the like. In some implementations, the top mirror structure 212 is formed from a p-type material. In some implementations, the top mirror structure 212 may have a thickness in a range from approximately 1 μm to approximately 6 μm, such as 3 μm. In some implementations, the top mirror structure 212 includes a set of layers (e.g., AlGaAs layers) grown using an MOCVD technique, an MBE technique, or another technique. In some implementations, the top mirror structure 212 is grown on or over the cavity/active region 208. In some implementations, a total thickness from a bottom surface of the bottom mirror structure 206 to a top surface of the top mirror structure 212 may be in a range from, for example, approximately 4.5 μm to approximately 26.4 μm, such as approximately 8.6 μm. In some implementations, a thickness of one or more of the layers of the emitter array 200 may be selected in order to provide a structure that achieves high reflectively (e.g., greater than approximately 99% reflectivity). In some implementations, a smaller total thickness may facilitate growth time reduction of the emitter array 200 or stress reduction within the emitter array 200.

The top contact layer 214 is a top contact layer of the emitter array 200 that makes electrical contact with the top mirror structure 212 through which current may flow. In some implementations, the top contact layer 214 includes an annealed metallization layer. For example, the top contact layer 214 may include a chromium-gold (Cr—Au) layer, a gold-zinc (Au—Zn) layer, a titanium-platinum-gold (TiPtAu) layer, a gold-germanium-nickel (AuGeNi) layer, a palladium-germanium-gold (PdGeAu) layer, or the like. In some implementations, the top contact layer 214 has a thickness in a range from approximately 0.03 μm to approximately 0.3 μm, such as 0.2 μm. In some implementations, the top contact layer 214 has a ring shape, a slotted ring shape, a tooth wheel shape, or another type of circular or non-circular shape (e.g., depending on a design of the VCSELs in the emitter array 200).

The top metal 216 is a top metal layer at a front side of the emitter array 200. In some implementations, the top metal 216 is formed from a p-type material. Alternatively, in some implementations, the top metal 216 is formed from an n-type material. In some implementations, the top metal 216 may be a layer that makes electrical contact with the top contact layer 214. In some implementations, the top metal 216 serves as an anode for the emitter array 200. In some implementations, the top metal 216 may serve as a cathode for the emitter array 200. For example, in some implementations, the top metal 216 may serve as an isolated cathode for a particular sub-array of a VCSEL array including a group of sub-arrays, where the emitter array 200 is one of the group of sub-arrays.

FIG. 2B is a diagram illustrating an example of a cross section of a top-emitting VCSEL in the emitter array 200 with the layers shown in FIG. 2A. As shown in FIG. 2B, the top metal 216 is insulated from sidewalls of the trenches by a dielectric layer 218, which may be, for example, silicon nitride (SiN), silicon dioxide ($SiO_2$), a polymer dielectric, or another type of insulating material. Additionally, as shown in FIG. 2B, the VCSEL may have an isolation implant 220 to prevent free carriers from reaching edges of the trenches and/or to isolate adjacent VCSELs in the emitter array 200 from one another (e.g., if the trenches do not fully enclose the VCSELs of the emitter array 200).

FIG. 2C is a diagram illustrating an example of a cross section of a bottom-emitting VCSEL in the emitter array 200 with the layers shown in FIG. 2A. The structure of the bottom-emitting VCSEL may be similar to that of the top-emitting VCSEL shown in FIG. 2B with some exceptions. For example, as illustrated in FIG. 2C, in the case of the bottom-emitting VCSEL, an opening is present in the bottom metal 204 to permit emission of light out of the substrate 202. In some implementations, as shown in FIG. 2C, an anti-reflective (AR) coating 222 may be formed in the opening in the bottom metal 204. As further shown in FIG. 2C, in the bottom-emitting VCSEL, the top metal 216 covers the top surface of the VCSEL emitter over the top contact layer 214. Other examples of structural differences between the top-emitting VCSEL and the bottom-emitting VCSEL may include the top contact layer 214 and the top metal 216 being differently formed in the bottom-emitting VCSEL, the positions of the top mirror structure 212 and the bottom mirror structure 206 being reversed (not illustrated in FIG. 2C) in the bottom-emitting VCSEL, the substrate 202 being thinned in the bottom-emitting VCSEL (not illustrated in FIG. 2C), or one or more OA layers (e.g., one or more OA layers 210) being differently formed, among other examples.

The number, arrangement, thicknesses, order, symmetry, or the like, of layers shown in FIGS. 2A-2C are provided as examples. In practice, emitter array 200 may include additional layers, fewer layers, different layers, differently constructed layers, or differently arranged layers than those shown in FIGS. 2A-2C. For example, the emitter array 200 may include one or more cladding layers, one or more spacer layers (e.g., near the bottom mirror structure 206, the OA layer 210, and/or the top mirror structure 212), one or more additional mirror structures, or the like, not shown in FIGS. 2A-2C. Additionally, or alternatively, a set of layers (e.g., one or more layers) of emitter array 200 may perform one or more functions described as being performed by another set of layers of emitter array 200, and any layer may comprise more than one layer.

FIGS. 3A-3D illustrate simplified band diagrams of example implementations of the cavity/active region 208 of the emitter array 200, as described herein.

Conventionally, when using plasma-assisted MBE to grow a dilute nitride active region (e.g., an active region including an InGaAsNSb QW and a GaAsN QWB), gallium flux and atomic nitrogen flux are kept constant to mitigate potential growth variation. However, maintaining a constant gallium flux and atomic nitrogen flux provides a band gap between a given QW and an adjacent QWB (herein referred to as a QWB band gap) that is insufficient to achieve carrier confinement that enables adequate performance at higher temperatures. Therefore, to enable adequate performance at higher temperatures, the cavity/active region 208 may in some implementations have an increased QWB band gap (e.g., as compared to a QWB band gap in a conventional dilute nitride long-wavelength emitter).

Figure 3A:
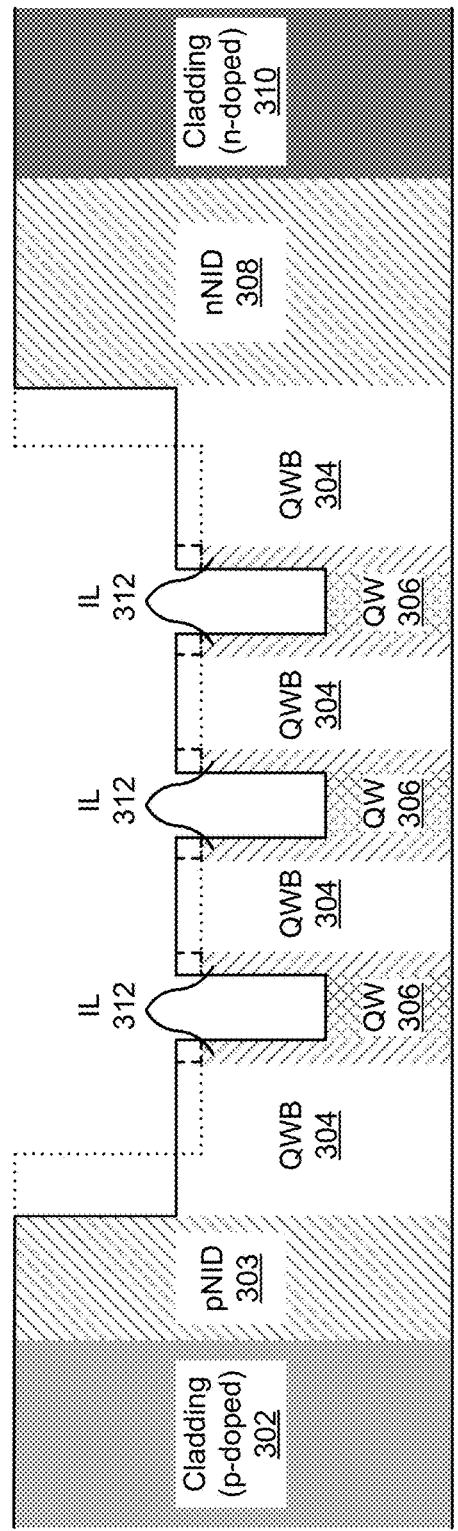
FIGS. 3A-3D illustrate simplified band diagrams of example implementations of an a cavity and active region of a dilute nitride long-wavelength emitter with improved performance over temperature, as described herein.

FIG. 3A is a simplified band diagram of an example implementation of the cavity/active region 208 in which improved carrier confinement, carrier injection, and/or capture efficiency is achieved by increasing a QWB band gap. As indicated in the band diagram shown in FIG. 3A, the cavity/active region 208 may include a p-doped cladding layer 302, a p-side non-intentionally doped (pNID) layer 303, a group of QWB layers 304, a group of QW layers 306, an n-side non-intentionally doped (nNID) layer 308, and an n-doped cladding layer 310.

The cladding layers of the cavity/active region 208—the p-doped cladding layer 302 and the n-doped cladding layer 310—are layers associated with injecting charge carriers and providing light confinement in the emitter array 200. For example, when a forward bias is applied, electrons are injected from the n-doped cladding layer 310 and into the active layers of the cavity/active region 208 (e.g., into the QW layers 306 and the QWB layers 304), and holes are supplied from the p-doped cladding layer 302. As indicated in FIG. 3A, the p-doped cladding layer 302 and the n-doped cladding layer 310 have a higher band gap energy than the QW layers 306 and the QWB layers 304. Therefore, the p-doped cladding layer 302 and the n-doped cladding layer 310 prevent the injected electrons and holes from diffusing across the emitter junction. Here, the electrons and holes are confined to the active layers of the cavity/active region 208 to create a state of population inversion, thereby allowing amplification of light by stimulated emission. In some implementations, the p-doped cladding layer 302 may be, for example, a carbon-doped GaAs layer with a doping level in a range from approximately $1 \times 10^{16}$ cm$^{-3}$ to approximately $4 \times 10^{18}$ cm$^{-3}$, such as $1 \times 10^{17}$ cm$^{-3}$. In some implementations, the p-doped cladding layer 302 may have a thickness in a range from approximately 50 μm to approximately 2000 μm, such as 200 μm. In some implementations, the n-doped cladding layer 310 may be, for example, a silicon-doped GaAs layer with a doping level in a range from approximately $1 \times 10^{16}$ cm$^{-3}$ to approximately $4 \times 10^{18}$ cm$^{-3}$, such as $5 \times 10^{17}$ cm$^{-3}$. In some implementations, the n-doped cladding layer 310 may have a thickness in a range from approximately 50 μm to approximately 2000 μm, such as 200 μm.

In some implementations, the pNID layer 303 is formed between the p-doped cladding layer 302 and a QWB layer 304 nearest to the p-doped cladding layer 302. In some implementations, the pNID layer 303 serves to ensure that p-type doping is not applied to other layers of the cavity/active region 208, such as the QWB layer 304 nearest to the p-doped cladding layer 302. As indicated in FIG. 3A, pNID layer 303 may have a band gap energy that matches that of the p-doped cladding layer 302. In some implementations, the pNID layer 303 may be, for example, a GaAs layer with a thickness in a range from approximately 0 nm to approximately 500 nm, such as 5 nm.

In some implementations, the nNID layer 308 is formed between the n-doped cladding layer 310 and a QWB layer 304 nearest to the n-doped cladding layer 310. In some implementations, the nNID layer 308 serves to ensure that n-type doping is not applied to other layers of the cavity/active region 208, such as the QWB layer 304 nearest to the n-doped cladding layer 310. As indicated in FIG. 3A, nNID layer 308 may have a band gap energy that matches that of the n-doped cladding layer 310. In some implementations, the nNID layer 308 may be, for example, a GaAs layer with a thickness in a range from approximately 0 nm to approximately 500 nm, such as 50 nm.

The QW layers 306 and the QWB layers 304 of the cavity/active region 208 form the active layers (also referred to as a gain region or gain medium) in which lasing of the emitter array 200 is achieved. As shown in FIG. 3A, the cavity/active region 208 may in some implementations include one or more QW layers 306, and each QW layer 306 may be between a pair of QWB layers 304. As shown in FIG. 3A, an energy band gap of a given QWB layer 304 is higher than that of a given QW layer 306. As further shown, an energy band gap of a given QWB layer 304 is lower than that of the p-doped cladding layer 302, the pNID layer 303, the nNID layer 308, and the n-doped cladding layer 310. In some implementations, a QW layer 306 may be, for example, an InGaAsNSb layer with a thickness in a range from approximately 5 nm to approximately 12 nm, such as 7 nm. In some implementations, a QWB layer 304 may be, for example, a GaAsN layer with a thickness in a range from 5 nm to approximately 40 nm, such as 20 nm.

As noted above, the band gap of the QWB layers 304 of the cavity/active region 208 may in some implementations be increased (e.g., as compared to a conventional dilute nitride long-wavelength emitter) to improve performance of the emitter array 200 over temperature. In some implementations, to increase the band gap of the QWB layer 304, a percentage of nitrogen (N %) can be reduced (e.g., by approximately 20% or more relative to a conventional QWB). In some implementations, the percentage of nitrogen can be reduced by decreasing a nitrogen flux or by increasing a growth rate during growth of the cavity/active region 208. In some implementations, the nitrogen flux can be adjusted by changing a plasma source setting used during growth, such as a power setting or a nitrogen ($N_2$) gas flow setting. For comparison, it may be desirable to adjust gallium flux by switching between, or combining the use of, multiple gallium sources to increase the growth rate, which reduces the percentage of nitrogen in a given QWB layer 304.

In some implementations, in association with forming the cavity/active region 208, a QW layer 306 may be formed using an epitaxial growth process. During growth of the QW layer 306, the epitaxial growth process may be performed according to a first growth mode. Next, a QWB layer 304 may be formed using the epitaxial growth process. However, during growth of the QWB layer 304, the epitaxial growth process may be performed according to a second growth mode. Here, a nitrogen flux used in the first growth mode may be different from a nitrogen flux used in the second growth mode, or a gallium flux used in the first growth mode may be different from a gallium flux used in the second growth mode. In this way, the different growth modes may be used in association with forming the QW layers 306 and the QWB layers 304 of the cavity/active region 208, thereby enabling formation of QWB layers 304 with higher band gaps (e.g., as compared to the QWB band gap in a conventional dilute nitride long-wavelength emitter).

The dotted line in FIG. 3A indicates the band gap structure of a conventional dilute nitride long-wavelength emitter. As shown by comparing the dotted line in FIG. 3A and the upper solid line in FIG. 3A, the QWB layers 304 of the cavity/active region 208 have a higher band gap than the QWB band gap in the conventional dilute nitride long-wavelength emitter. As a result, carrier confinement, carrier injection, and/or capture efficiency can be improved.

As further shown in FIG. 3A, the cavity/active region 208 may in some implementations be formed to include an interlayer (IL) 312. As shown in FIG. 3A, the interlayer 312 may have a band gap that is lower than that of a given QWB layer 304 and that is higher than that of a given QW layer 306. That is, the interlayer 312 may have a band gap that is between that of a QW layer 306 and a QWB layer 304. In some implementations, the interlayer 312 improves carrier injection into a given QW layer 306 (e.g., by providing a band gap "transition" between the higher band gap of the QWB layer 304 and the lower band gap of the QW layer 306). In some implementations, the interlayer 312 may reduce a growth interference risk (e.g., when using a different gallium source or changing a nitrogen plasma source setting to accommodate an optimal growth condition for a QW layer 306). In some implementations, the interlayer 312 may be, for example, a GaAsN layer that has a thickness in a range from approximately 0.1 nm to 10.0 nm, such as 1 nm. In some implementations, the interlayer 312 may be formed using the epitaxial growth process, and during growth of the interlayer 312 the epitaxial growth process may be performed according to the first growth mode (e.g., the growth mode used in association with growing a given QW layer 306 of the cavity/active region 208).

Figure 3B:
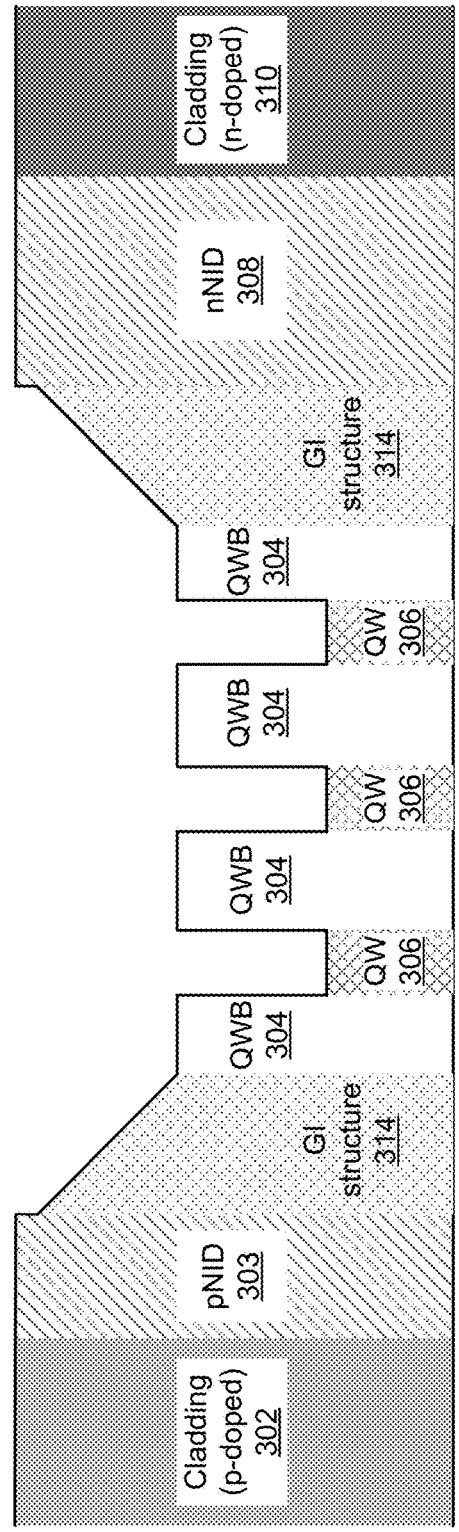
Figure 3C:
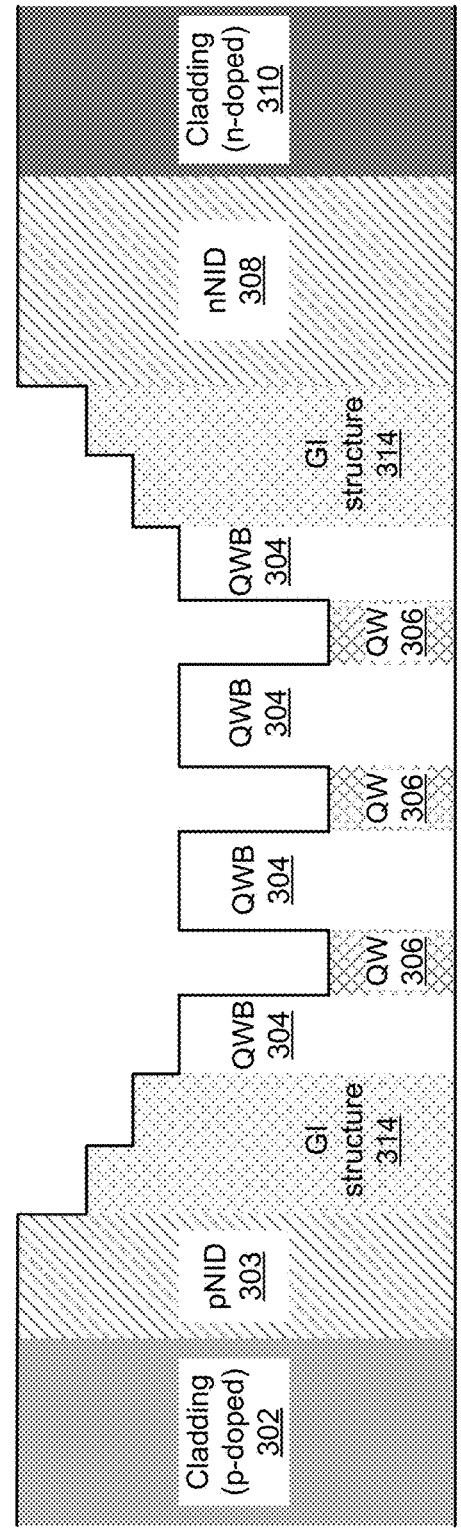

In some implementations, improved carrier confinement, improved carrier injection, or improved capture efficiency can be achieved by including a graded-index structure in the cavity/active region 208. FIGS. 3B and 3C are simplified energy band diagrams of example implementations of the cavity/active region 208 in which improved carrier confinement, carrier injection, or capture efficiency is achieved by including a graded-index structure 314 in the cavity/active region 208. In some implementations, a percentage of nitrogen in the graded-index structure increases in the graded-index structure 314 in a direction moving toward a center of the cavity/active region 208 (e.g., a direction from the pNID layer 303 toward a nearest QWB layer 304 layer, a direction from the nNID layer 308 toward a nearest QWB layer 304). In some implementations, the graded-index structure 314 may be, for example, a graded-index separate confinement heterostructure (GRINSCH).

In some implementations, as illustrated in FIGS. 3B and 3C, the graded-index structure 314 may be formed as an outer barrier layer of the cavity/active region 208 (e.g., a layer between the pNID layer 303 and a nearest QWB layer 304, a layer between the nNID layer 308 and a nearest QWB layer 304). Additionally, or alternatively, a graded-index structure 314 may be formed in the pNID layer 303 and/or the p-doped cladding layer 302. Additionally, or alternatively, a graded-index structure 314 may be formed in the nNID layer 308 and/or the n-doped cladding layer 310. Additionally, or alternatively, a graded-index structure 314 may be partially doped. For example, a graded-index structure 314 may be doped in layers nearer to the p-doped cladding layer 302, or the n-doped cladding layer 310, in the absence of the pNID layer 303, nNID layer 308, respectively. In some implementations, a graded-index structure may be a GaAsN layer (in which a percentage of nitrogen varies) having a thickness in a range from approximately 5 nm to approximately 500 nm, such as 20 nm.

In some implementations, the graded-index structure 314 reduces carrier leakage and enhances carrier injection and capture into the QW layers 306 of the cavity/active region 208. In some implementations, the graded-index structure 314 may have a linear grading, an example of which is shown in FIG. 3B. Alternatively, in some implementations, the graded-index structure 314 may have a step grading (i.e., a series of step-grades), an example of which is shown in FIG. 3C. In some implementations, the graded-index structure may have a combination of step-grades and linear grades. In some implementations, the type of grading may be selected based on, for example, which growth mode is simpler or more reliable in dilute nitride epitaxial growth.

Figure 3D:
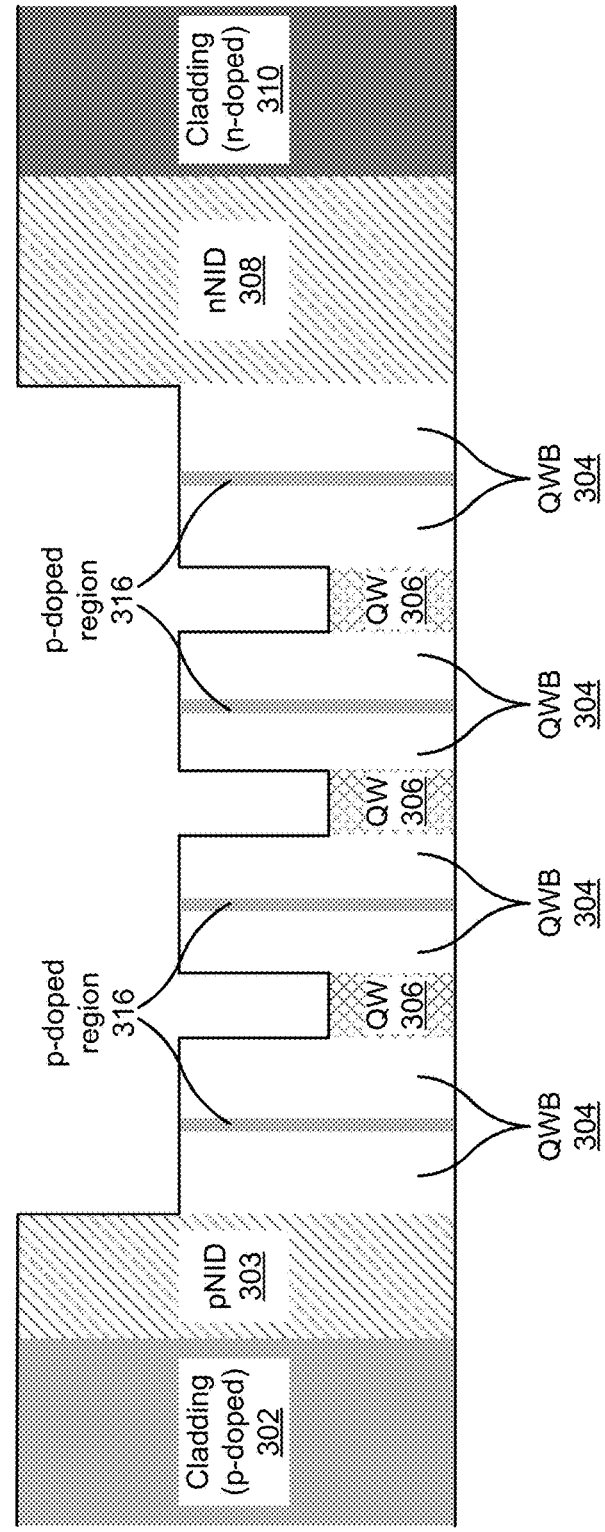

In some implementations, improved carrier confinement, improved carrier injection, or improved capture efficiency can be achieved by including a p-doped region in one or more QWB layers 304 of the cavity/active region 208. FIG. 3D is a simplified energy band diagram of an example implementation of the cavity/active region 208 in which improved carrier confinement, carrier injection, or capture efficiency is achieved by including one or more p-doped regions 316 in one or more QWB layers 304 of the cavity/active region 208.

In some implementations, a p-doped region 316 may be a carbon p-type doped region. In some implementations, a doping level of the p-type doping of a given p-doped region 316 may be in a range from approximately $1 \times 10^{16}$ cm$^{-3}$ to approximately $1 \times 10^{19}$ cm$^{-3}$, such as $5 \times 10^{17}$ cm$^{-3}$. In some implementations, a p-doped region 316 can be formed at or near a center region of a QWB layer 304. In some implementations, the p-doped region 316 has a thickness in a range from approximately 0.2 nm to approximately 20 nm, such as 2 nm. In some implementations, the p-doped region 316 has a thickness that matches a thickness of the QWB layer 304. In some implementations, delta-doping may be utilized to form a given p-doped region 316.

Notably, p-type doping in a QWB layer 304 could in some cases degrade photoluminescence (PL) intensity or cause wavelength shift. Further, p-type doping can increase cavity absorption. Therefore, in some implementations, the doping level of a given p-doped region 316 and doped layer thickness of the given p-doped region 316 can be selected so as to balance overall performance.

The one or more p-doped regions 316 improve performance of the emitter array 200 at higher temperatures. For example, the one or more p-doped regions 316 can increase a $T_0$ parameter, which is a parameter that characterizes a threshold current $I_{th}$ temperature dependence through the formula: $I_{th}(T)=I_{th}(0)\exp(T/T_0)$.

Notably, in some implementations, the techniques described in association with FIGS. 3A-3D can be used in any combination in order to achieve improved carrier confinement, improved carrier injection, or improved capture efficiency of the emitter array 200. For example, the emitter array 200 may include an cavity/active region 208 including (1) one or more QWB layers 304 having an increased band gap (as described with respect to FIG. 3A), (2) one or more graded-index structures 314 (as described with respect to FIGS. 3B and 3C), and (3) one or more p-doped regions 316 (as described with respect to FIG. 3D) in order to achieve improved carrier confinement, improved carrier injection, or improved capture efficiency.

In this way, performance of a dilute nitride long-wavelength emitter over temperature can be improved. For example, the emitter array 200 described herein may achieve improved carrier confinement, improved carrier injection, or improved capture efficiency by including an increased QWB band gap for a given QWB layer 304, one or more graded-index structures 314, or one or more p-doped regions 316 in the cavity/active region 208. In the same way, the performance of a dilute nitride long-wavelength emitter at higher operating current could also be improved.

As indicated above, FIGS. 3A-3D are provided as examples. Other examples may differ from what is described with regard to FIGS. 3A-3D.

Figure 4:
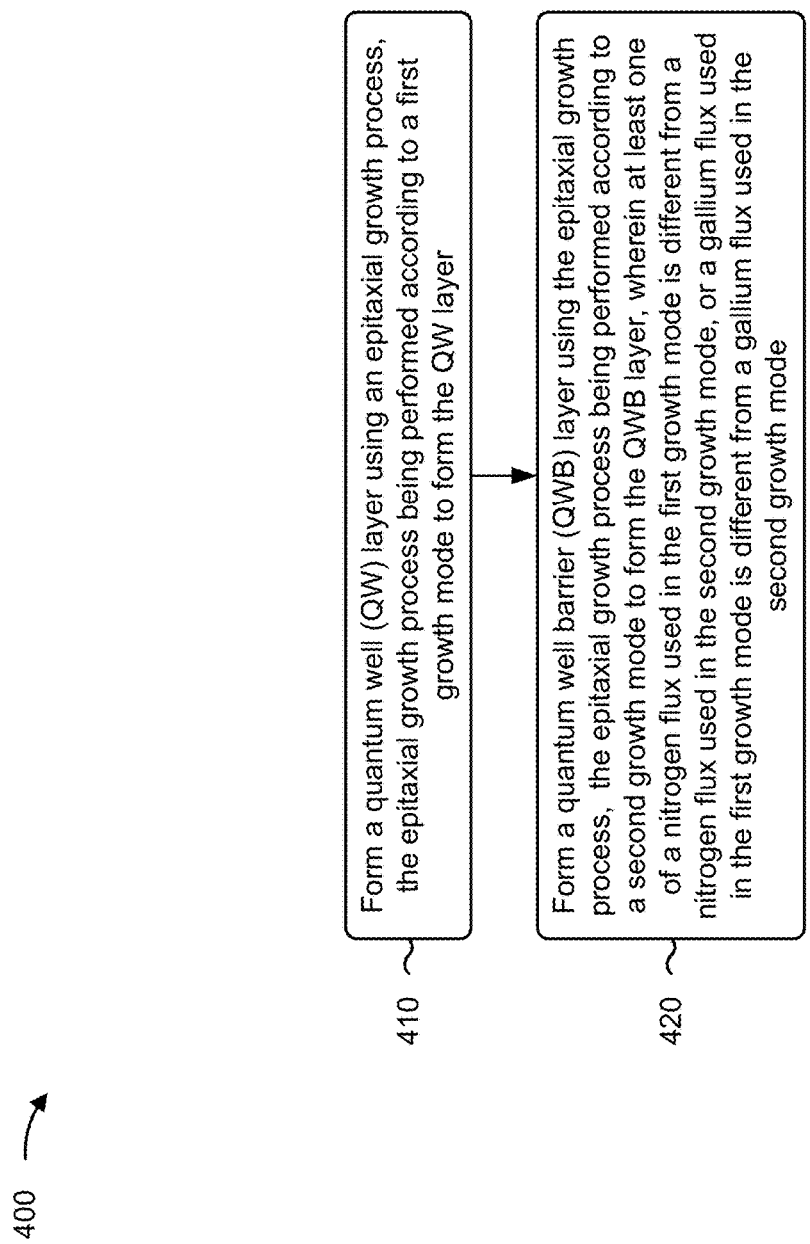
FIG. 4 is a flowchart of an example process associated with forming a dilute nitride long-wavelength emitter with improved performance over temperature, as described herein.

FIG. 4 is a flowchart of an example process 400 associated with forming a dilute nitride long-wavelength emitter with improved performance over temperature, as described herein.

As shown in FIG. 4, process 400 may include forming a QW layer using an epitaxial growth process, the epitaxial growth process being performed according to a first growth mode to form the QW layer (block 410). For example, a QW layer may be formed using an epitaxial growth process, the epitaxial growth process being performed according to a first growth mode to form the QW layer, as described above.

As further shown in FIG. 4, process 400 may include forming a QWB layer using the epitaxial growth process, the epitaxial growth process being performed according to a second growth mode to form the QWB layer, wherein at least one of a nitrogen flux used in the first growth mode is different from a nitrogen flux used in the second growth mode, or a gallium flux used in the first growth mode is different from a gallium flux used in the second growth mode (block 420). For example, a QWB layer may be formed using the epitaxial growth process, the epitaxial growth process being performed according to a second growth mode to form the QWB layer, wherein at least one of a nitrogen flux used in the first growth mode is different from a nitrogen flux used in the second growth mode, or a gallium flux used in the first growth mode is different from a gallium flux used in the second growth mode, as described above.

Process 400 may include additional implementations, such as any single implementation or any combination of implementations described below and/or in connection with one or more other processes described elsewhere herein.

In a first implementation, process 400 includes forming a graded-index outer barrier layer.

In a second implementation, alone or in combination with the first implementation, process 400 includes forming a p-doped region in the QWB layer.

In a third implementation, alone or in combination with one or more of the first and second implementations, process 400 includes adjusting a plasma source setting associated with the epitaxial growth process, wherein a difference between the nitrogen flux used in the first growth mode and the nitrogen flux used in the second growth mode is a result of the adjusting of the plasma source setting.

In a fourth implementation, in combination with the third implementation, the plasma source setting is a power setting.

In a fifth implementation, in combination with one or more of the third and fourth implementations, the plasma source setting is a nitrogen gas flow setting.

In a sixth implementation, alone or in combination with one or more of the first through fifth implementations, process 400 includes switching a gallium source associated with the epitaxial growth process, wherein a difference between the gallium flux used in the first growth mode and the gallium flux used in the second growth mode is a result of the switching of the gallium source.

In a seventh implementation, alone or in combination with one or more of the first through sixth implementations, process 400 includes adjusting a quantity of gallium sources used for performing the epitaxial growth process, wherein a difference between the gallium flux used in the first growth mode and the gallium flux used in the second growth mode is a result of the adjusting of the quantity of gallium sources.

In an eighth implementation, alone or in combination with one or more of the first through seventh implementations, process 400 includes forming an interlayer between the QW layer and the QWB layer, where a band gap between the interlayer and the QW layer is smaller than a band gap between the QWB layer and the QW layer.

In a ninth implementation, in combination with the eighth implementation, the interlayer has a thickness in a range from approximately 0.1 nanometers (nm) to 10.0 nm.

In a tenth implementation, alone or in combination with one or more of the eighth and ninth implementations, the interlayer is formed by performing the epitaxial growth process according to the first growth mode.

Although FIG. 4 shows example blocks of process 400, in some implementations, process 400 includes additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A method, comprising:
forming a quantum well (QW) layer using an epitaxial growth process, the epitaxial growth process being performed according to a first growth mode to form the QW layer, the QW layer comprising a first dilute nitride material; and
forming a quantum well barrier (QWB) layer using the epitaxial growth process, the epitaxial growth process being performed according to a second growth mode to form the QWB layer, the QWB layer comprising a second dilute nitride material, wherein at least one of:
a nitrogen flux used in the first growth mode is different from a nitrogen flux used in the second growth mode, or
a gallium flux used in the first growth mode is different from a gallium flux used in the second growth mode.

2. The method of claim 1, further comprising forming a graded-index outer barrier layer.

3. The method of claim 1, further comprising forming a p-doped region in the QWB layer.

4. The method of claim 1, wherein the nitrogen flux used in the first growth mode is different from the nitrogen flux used in the second growth mode, the method further comprising adjusting a plasma source setting associated with the epitaxial growth process, wherein a difference between the nitrogen flux used in the first growth mode and the nitrogen flux used in the second growth mode is a result of the adjusting of the plasma source setting.

5. The method of claim 4, wherein the plasma source setting is a power setting.

6. The method of claim 4, wherein the plasma source setting is a nitrogen gas flow setting.

7. The method of claim 1, wherein the gallium flux used in the first growth mode is different from the gallium flux used in the second growth mode, the method further comprising switching a gallium source associated with the epitaxial growth process, wherein a difference between the gallium flux used in the first growth mode and the gallium flux used in the second growth mode is a result of the switching of the gallium source.

8. The method of claim 1, wherein the gallium flux used in the first growth mode is different from the gallium flux used in the second growth mode, the method further comprising adjusting a quantity of gallium sources used for performing the epitaxial growth process, wherein a difference between the gallium flux used in the first growth mode and the gallium flux used in the second growth mode is a result of the adjusting of the quantity of gallium sources.

9. The method of claim 1, further comprising forming an interlayer between the QW layer and the QWB layer, where a band gap between the interlayer and the QW layer is smaller than a band gap between the QWB layer and the QW layer.

10. The method of claim 9, wherein the interlayer has a thickness in a range from approximately 0.1 nanometers (nm) to 10.0 nm.

11. The method of claim 9, wherein the interlayer is formed by performing the epitaxial growth process according to the first growth mode.

12. A dilute nitride long-wavelength emitter, comprising:
a cladding layer;
an active region including:
one or more quantum well (QW) layers, wherein the one or more QW layers comprise a first dilute nitride material; and
one or more QW barrier (QWB) layers, wherein the one or more QWB layers comprise a second dilute nitride material; and
a barrier layer between the active region and the cladding layer, wherein the barrier layer comprises a graded-index structure.

13. The dilute nitride long-wavelength emitter of claim 12, wherein the graded-index structure is a graded-index separate confinement heterostructure (GRINSCH).

14. The dilute nitride long-wavelength emitter of claim 12, wherein the graded-index structure has a linear grading.

15. The dilute nitride long-wavelength emitter of claim 12, wherein the graded-index structure has a step grading.

16. The dilute nitride long-wavelength emitter of claim 12, further comprising a p-doped region in at least one QWB layer of the one or more QWB layers.

17. A dilute nitride long-wavelength emitter, comprising:
an active region including:
one or more quantum well (QW) layers, wherein the one or more QW layers comprise a first dilute nitride material; and
one or more QW barrier (QWB) layers, wherein the one or more QWB layers comprise a second dilute nitride material, and wherein at least one QWB layer of the one or more QWB layers includes a p-doped region.

18. The dilute nitride long-wavelength emitter of claim 17, wherein a doping level of the p-doped region is in a range from approximately $1\times10^{16}$ cm$^{-3}$ to approximately $1\times1019$ cm$^{-3}$.

19. The dilute nitride long-wavelength emitter of claim 17, wherein the p-doped region has a thickness in a range from approximately 0.2 nanometers (nm) to approximately 20.0 nm.

20. The dilute nitride long-wavelength emitter of claim 17, further comprising a barrier layer comprising a graded-index structure.

* * * * *